(12) United States Patent
Shen

(10) Patent No.: US 9,728,558 B2
(45) Date of Patent: Aug. 8, 2017

(54) ARRAY SUBSTRATE, MANUFACTURING METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Qiyu Shen, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/428,515

(22) PCT Filed: Jun. 30, 2014

(86) PCT No.: PCT/CN2014/081225
§ 371 (c)(1),
(2) Date: Mar. 16, 2015

(87) PCT Pub. No.: WO2015/109758
PCT Pub. Date: Jul. 30, 2015

(65) Prior Publication Data
US 2016/0005767 A1    Jan. 7, 2016

(30) Foreign Application Priority Data

Jan. 27, 2014   (CN) .......................... 2014 1 0041098

(51) Int. Cl.
*G09G 5/00* (2006.01)
*H01L 27/12* (2006.01)
(Continued)

(52) U.S. Cl.
CPC .......... *H01L 27/124* (2013.01); *G02F 1/1368* (2013.01); *G02F 1/136286* (2013.01);
(Continued)

(58) Field of Classification Search
None
See application file for complete search history.

(56) References Cited

U.S. PATENT DOCUMENTS 6,011,531 A * 1/2000 Mei .......................... G09G 3/20
345/90
6,310,683 B1 10/2001 Fujiwara et al.
(Continued)

FOREIGN PATENT DOCUMENTS

CN       1209612 A      3/1999
CN     101546768 A      9/2009
(Continued)

OTHER PUBLICATIONS

International Search Report with Notice of Transmittal of the International Search Report of PCT/CN2014/081225 in Chinese, mailed Oct. 27, 2014.
(Continued)

*Primary Examiner* — Ali Naraghi
(74) *Attorney, Agent, or Firm* — Collard & Roe, P.C.

(57) ABSTRACT

An array substrate, a manufacturing method thereof and a display device are provided; in the array substrate, two adjacent rows of the pixel units (200) are taken as a group of pixel unit rows; in each group of the pixel unit rows, since the pixel electrodes in two adjacent pixel units (200) of a same column are all electrically connected with one composite transistor (300), and the composite transistor (300) can be turned on or off under the control of different levels of control voltages, to charge the pixel electrodes in two adjacent pixel units (200) of the same column at different
(Continued)

times, each group of the pixel unit row can share a gate line located between the two rows of the pixel units, as compared with the conventional array substrate, the number of the gate lines disposed on the array substrate is reduced by half, so that the aperture ratio of the array substrate can be improved, and the brightness of the display panel can be further improved.

9 Claims, 7 Drawing Sheets

(51) Int. Cl.
   *G02F 1/1362* (2006.01)
   *G02F 1/1368* (2006.01)
   *H01L 29/786* (2006.01)

(52) U.S. Cl.
   CPC ...... *H01L 27/1251* (2013.01); *H01L 27/1259* (2013.01); *H01L 29/78633* (2013.01); *G02F 2001/13685* (2013.01); *G02F 2001/136295* (2013.01); *G02F 2201/40* (2013.01)

(56) References Cited

U.S. PATENT DOCUMENTS

| | | | |
|---|---|---|---|
| 8,158,978 | B2 | 4/2012 | Kim et al. |
| 8,384,439 | B2 | 2/2013 | Park et al. |
| 2012/0320026 | A1 | 12/2012 | Kitayama et al. |
| 2013/0075799 | A1* | 3/2013 | Oyamada ............ H01L 27/1255 257/296 |
| 2014/0009458 | A1 | 1/2014 | Nam et al. |
| 2014/0197412 | A1* | 7/2014 | Nishimura .......... G02F 1/13338 257/57 |
| 2014/0209894 | A1* | 7/2014 | Lee ................... H01L 29/66969 257/43 |

FOREIGN PATENT DOCUMENTS

| | | |
|---|---|---|
| CN | 202013886 U | 10/2011 |
| CN | 102725676 A | 10/2012 |
| CN | 102870220 A | 1/2013 |
| CN | 103529610 A | 1/2014 |
| CN | 103792746 A | 5/2014 |

OTHER PUBLICATIONS

Written Opinion of the International Searching Authority of PCT/CN2014/081225 in Chinese with English translation mailed Oct. 27, 2014.

Chinese Office Action of Chinese Application No. 201410041098.5, mailed Oct. 29, 2015 with English translation.

Second Chinese Office Action of Chinese Application No. 201410041098.5, mailed Mar. 15, 2016 with English translation.

* cited by examiner $V_d=-0.1V$

ARRAY SUBSTRATE, MANUFACTURING METHOD THEREOF AND DISPLAY DEVICE

CROSS REFERENCE TO RELATED APPLICATIONS

This application is the National Stage of PCT/CN2014081225/filed on Jun. 30, 2014, which claims priority under 35 U.S.C. §119 of Chinese Application No. 201410041098.5 filed on Jan. 27, 2014, the disclosure of which is incorporated by reference.

TECHNICAL FIELD

Embodiments of the invention relate to an array substrate, a manufacturing method thereof and a display device.

BACKGROUND

A thin-film transistor liquid crystal display (TFT-LCD) dominates a current flat-panel display market, due to characteristics such as small size, low power consumption, no radiation and relatively low fabrication cost.

The thin film transistor liquid crystal display mainly includes an opposite substrate and an array substrate, with a liquid crystal material disposed therebetween. In certain types of liquid crystal displays, by applying a common voltage to a transparent electrode on the opposite substrate and a data voltage to a pixel electrode of the array substrate, the liquid crystal deviates under an action of an electric field between a color filter substrate and the array substrate. An intensity and a direction of the electric field can be adjusted by a change of the data voltage, so a twist angle of the liquid crystal material can be controlled, so that an amount of transmitted light in the region can be controlled.

In the conventional thin film transistor liquid crystal display, a structure of the array substrate is illustrated in FIG. 1, comprising a base substrate, a plurality of pixel units 01 arranged in a matrix which are disposed on the base substrate, a gate line Gate disposed between the pixel units 01 in adjacent rows, a data line Data disposed between the pixel units 01 in adjacent columns, thin film transistors 02 disposed in the respective pixel units 01 as switch devices, and pixel electrodes electrically connected with the thin film transistors 02 (wherein a structure of the pixel electrodes is not illustrated in FIG. 1).

In the above-described conventional array substrate, one pixel unit is provided with a thin film transistor, and one pixel unit needs to be configured with one gate line and one data line, so that there is more wiring on the array substrate, which is unfavorable for design of an aperture ratio of the array substrate, and finally results in a low brightness of the thin film transistor liquid crystal display.

SUMMARY OF THE INVENTION

An embodiment of the present invention provides an array substrate, comprising a base substrate, and a plurality of pixel units arranged in a matrix, each of which has a pixel electrode;

With two adjacent rows of the pixel units as a group of pixel unit rows, each group of the pixel unit rows share one gate line located between the two rows of the pixel units, and there is one data line between every two adjacent columns of the pixel units;

In each group of the pixel unit row, pixel electrodes in two adjacent pixel units of a same column are respectively electrically connected with two output terminals of a composite transistor, a control terminal of the composite transistor being electrically connected with the gate line, and an input terminal of the composite transistor being electrically connected with the data line;

The composite transistor respectively opens conductive paths between the two output terminals and the input terminal under control of different levels of control voltages.

In the above-described array substrate provided by the embodiment of the present invention, two adjacent rows of the pixel units are taken as a group of pixel unit row; in each group of the pixel unit row, since the pixel electrodes in two adjacent pixel units of the same column are all electrically connected with one composite transistor, and the composite transistor can be turned on or off under the control of different levels of control voltages, to charge the pixel electrodes in two adjacent pixel units in the same column at different times, each group of the pixel unit row can share a gate line located between the two rows of the pixel units, as compared with the conventional array substrate, the number of the gate lines disposed on the array substrate is reduced by half, so that the aperture ratio of the array substrate can be improved, and the brightness of the display panel can be further improved.

For ease of implementation, in the above-described array substrate provided by the embodiment of the present invention, the composite transistor includes a first thin film transistor and a second thin film transistor, and an active layer of the first thin film transistor and an active layer of the second thin film transistor have opposite doping polarities; wherein, In each group of the pixel unit rows, a drain electrode of the first thin film transistor is electrically connected with the pixel electrode of the pixel unit located in a first row, a drain electrode of the second thin film transistor is electrically connected with the pixel electrode of the pixel unit located in a second row, a gate electrode of the first thin film transistor and a gate electrode of the second thin film transistor are respectively electrically connected with the gate line, and a source electrode of the first thin film transistor and a source electrode of the second thin film transistor are respectively electrically connected with the data line. The drain electrode of the first thin film transistor and the drain electrode of the second thin film transistor are respectively the two output terminals of the composite transistor, the source electrode of the first thin film transistor and the source electrode of the second thin film transistor are the input terminal of the composite transistor, and the gate electrode of the first thin film transistor and the gate electrode of the second thin film transistor are the control terminal of the composite transistor.

For example, threshold voltages of the first thin film transistor and the second thin film transistor have opposite polarities.

In order to further improve the aperture ratio of the array substrate, in the above-described array substrate provided by the embodiment of the present invention, in the composite transistor, the first thin film transistor and the second thin film transistor are disposed in a stacking manner in a direction perpendicular to the base substrate.

For ease of implementation, in the above-described array substrate provided by the embodiment of the present invention, the first thin film transistor is located between the base substrate and the second thin film transistor, the first thin film transistor is a thin film transistor of top gate type, and the second thin film transistor is a thin film transistor of bottom gate type; or, The second thin film transistor is located between the base substrate and the first thin film transistor, the first thin film transistor is a thin film transistor of bottom gate type, and the second thin film transistor is a thin film transistor of top gate type.

For ease of implementation, in the above-described array substrate provided by the embodiment of the present invention, the first thin film transistor and the second thin film transistor share a gate electrode.

For ease of implementation, in the above-described array substrate provided by the embodiment of the present invention, the first thin film transistor is located between the base substrate and the second thin film transistor, a first light-blocking layer is disposed between the base substrate and the first thin film transistor, and an orthographic projection of the first light-blocking layer on the base substrate covers an orthographic projection of the active layer of the first thin film transistor on the base substrate;

The second thin film transistor is located between the base substrate and the first thin film transistor, a second light-blocking layer is disposed between the base substrate and the second base substrate, and an orthographic projection of the second light-blocking layer on the base substrate covers an orthographic projection of the active layer of the second thin film transistor on the base substrate.

In order to reduce a surface resistance among the source electrode, the drain electrode and the active layer in the thin film transistor, in the above-described array substrate provided by the embodiment of the present invention, a first ohmic contact layer is disposed between the active layer and the source electrode, and between the active layer and the drain electrode of the first thin film transistor; and/or, a second ohmic contact layer is disposed between the active layer and the source electrode, and between the active layer and the drain electrode of the second thin film transistor.

For ease of implementation, in the above-described array substrate provided by the embodiment of the present invention, the data line and the source electrode of the first thin film transistor are disposed on a same layer, and the source electrode of the second thin film transistor is electrically connected with the data line through a via hole; or The data line and the source electrode of the second thin film transistor are disposed on a same layer, and the source electrode of the first thin film transistor is electrically connected with the data line through a via hole.

An embodiment of the present invention provides a manufacturing method of an array substrate, comprising:

Forming a pattern including pixel electrodes of pixel units, a gate line, a data line and a composite transistor on the base substrate, wherein, With two adjacent rows of pixel units as a group of pixel unit row, each group of the pixel unit rows share one gate line located between the two rows of pixel units, and there is one data line between every two adjacent columns of pixel units;

In each group of the pixel unit rows, pixel electrodes in two adjacent pixel units of a same column are respectively electrically connected with two output terminals of the composite transistor, a control terminal of the composite transistor being electrically connected with the gate line, an input terminal of the composite transistor being electrically connected with the data line; wherein, The composite transistor respectively opens conductive paths between the two output terminals and the input terminal under control of different levels of control voltages.

In the above-described manufacturing method provided by the embodiment of the present invention, forming the pattern of the composite transistor on the base substrate, includes:

Forming a pattern including a first thin film transistor and a second thin film transistor on the base substrate; wherein, An active layer of the first thin film transistor and an active layer of the second thin film transistor have opposite doping polarities; in each group of the pixel unit rows, a drain electrode of the first thin film transistor is electrically connected with the pixel electrodes of the pixel units located in a first row, a drain electrode of the second thin film transistor is electrically connected with the pixel electrodes of the pixel units located in a second row, a gate electrode of the first thin film transistor and a gate electrode of the second thin film transistor are respectively electrically connected with the gate line, and a source electrode of the first thin film transistor and a source electrode of the second thin film transistor are respectively electrically connected with the data line. The drain electrode of the first thin film transistor and the drain electrode of the second thin film transistor are respectively the two output terminals of the composite transistor, the source electrode of the first thin film transistor and the source electrode of the second thin film transistor are the input terminal of the composite transistor, and the gate electrode of the first thin film transistor and gate electrode of the second thin film transistor are the control terminal of the composite transistor.

For example, threshold voltages of the first thin film transistor and the second thin film transistor have opposite polarities.

In the above-described manufacturing method provided by the embodiment of the present invention, forming the pattern including the first thin film transistor and the second thin film transistor on the base substrate includes:

Forming a pattern including the source electrode and the drain electrode of the first thin film transistor on the base substrate;

Forming a pattern including the active layer of the first thin film transistor on the source electrode and the drain electrode of the first thin film transistor;

Forming a first gate electrode insulating layer on the active layer of the first thin film transistor and forming a pattern including the gate electrode on the first gate electrode insulating layer;

Forming a second gate electrode insulating layer on the gate electrode, and forming a pattern including the active layer of the second thin film transistor on the second gate electrode insulating layer;

Forming a pattern including the source electrode and the drain electrode of the second thin film transistor on the active layer of the second thin film transistor.

In the above-described manufacturing method provided by the embodiment of the present invention, forming the pattern including data lines on the base substrate includes:

Forming the pattern including the data lines on the base substrate while forming the pattern including the source electrode and the drain electrode of the first thin film transistor on the base substrate, the source electrode of the second thin film transistor being electrically connected with the data lines; or Forming the pattern including the data lines on the active layer of the second thin film transistor while forming the pattern including the source electrode and the drain electrode of the second thin film transistor on the active layer of the second thin film transistor, the source electrode of the first thin film transistor being electrically connected with the data lines.

In the above-described manufacturing method provided by the embodiment of the present invention, the forming the pattern including gate lines on the base substrate includes:

Forming a pattern including the gate lines on the active layer of the first thin film transistor while forming the pattern including the gate electrode insulated from the active layer on the active layer of the first thin film transistor.

In the above-described manufacturing method provided by the embodiment of the present invention, forming the pattern including the pixel electrodes of pixel units on the base substrate, includes:

Forming a passivation layer above the drain electrode of the second thin film transistor and forming a pattern including the pixel electrodes of the pixel units on the passivation layer, after forming the pattern including the source electrode and the drain electrode of the second thin film transistor on the base substrate; wherein, the pixel electrodes in the pixel units located in the first row are electrically connected with the drain electrode of the first thin film transistor through a first via hole running through the first gate electrode insulating, layer, the second gate electrode insulating layer and the passivation layer, and the pixel electrodes in the pixel units located in the second row are electrically connected with the drain electrode of the second thin film transistor through a second via hole running through the passivation layer.

In the above-described manufacturing method provided by the embodiment of the present invention, after forming the pattern including the source electrode and the drain electrode of the first thin film transistor on the base substrate, and before forming the pattern including the active layer of the first thin film transistor on the source electrode and the drain electrode of the first thin film transistor, the method further comprises: forming a pattern including a first ohmic contact layer between the source electrode and the to-be-formed active layer of the first thin film transistor, and between the drain electrode and the to-be-formed active layer of the first thin film transistor; and/or After forming the pattern including the active layer of the second thin film transistor insulated from the gate electrode on the gate electrode, and before forming the pattern including the source electrode and the drain electrode of the second thin film transistor on the active layer of the second thin film transistor, the method further comprises: forming a pattern including a second ohmic contact layer between the active layer and the to-be-formed source electrode of the second thin film transistor, and between the active layer and the to-be-formed drain electrode of the second thin film transistor.

In the above-described manufacturing method provided by the embodiment of the present invention, before forming the pattern including the source electrode and the drain electrode of the first thin film transistor on the base substrate, the method further comprises:

Forming a pattern including a first light-blocking layer between the base substrate and the to-be-formed first thin film transistor, an orthographic projection of the first light-blocking layer on the base substrate covering an orthographic projection of the active layer of the first thin film transistor on the base substrate.

An embodiment of the present invention provides a display device, comprises any one of the above-described array substrates provided by the embodiment of the present invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 6b is a sectional view along an A-A' direction in FIG. 6a; and

FIG. 6c is a sectional view along a B-B' direction in FIG. 6a.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Sizes and shapes of respective parts in the accompanying drawings do not reflect true proportions of the array substrate, but only aim to illustrate content of the present invention.

Figure 1:
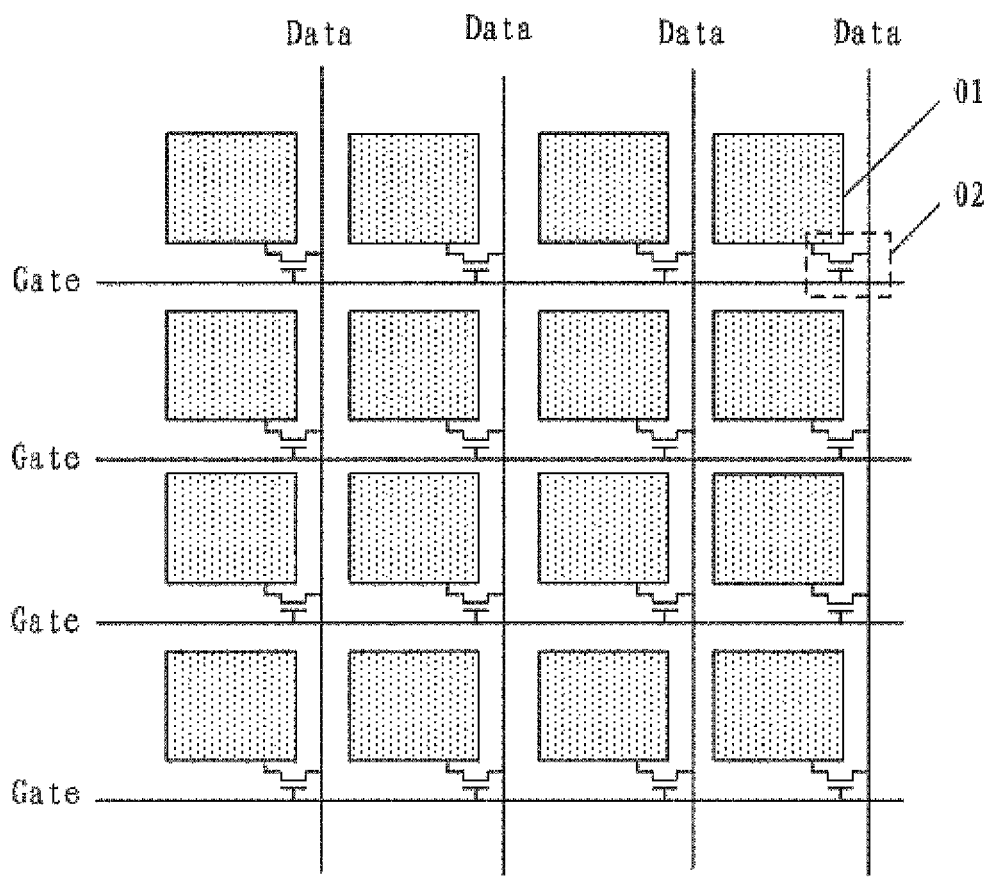
FIG. 1 is a structural schematic diagram of a conventional array substrate.
Figure 2:
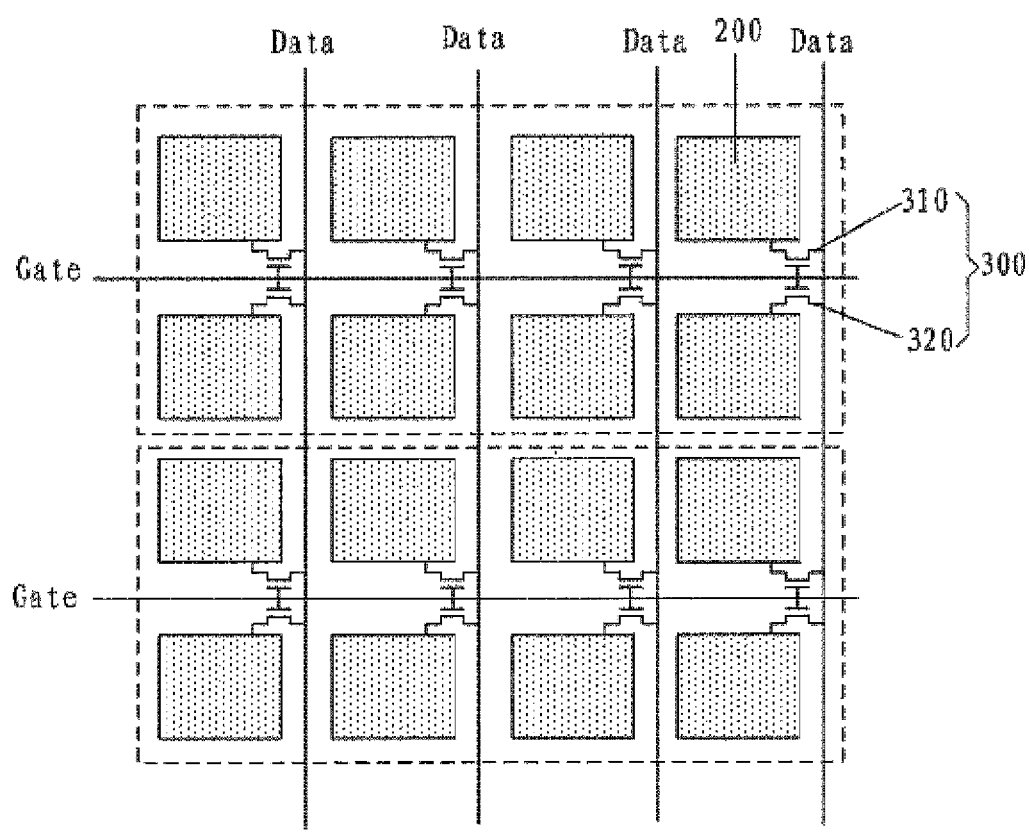
FIG. 2 is a structural schematic diagram of an array substrate provided by an embodiment of the present invention.

An embodiment of the present invention provides an array substrate, as illustrated in FIG. 2, comprising a base substrate (not illustrated), and a plurality of pixel units 200 arranged in a matrix which have pixel electrodes (wherein a structure of the pixel electrodes is not illustrated in FIG. 2);

With two adjacent rows of the pixel units 200 as a group of pixel unit rows (illustrated in a dashed box in FIG. 2), each group of the pixel unit rows share one gate line Gate located between the two rows of the pixel units 200, and there is one data line Data between every two adjacent columns of the pixel units 200;

In each group of the pixel unit rows, pixel electrodes in two adjacent pixel units 200 of a same column are respectively electrically connected with two output terminals of a composite transistor 300, control terminals of the respective composite transistors 300 being electrically connected with the gate line Gate, and input terminals of the respective composite transistor 300 being electrically connected with the data line Data;

The composite transistor 300 is turned on or off under the control of different levels of control voltages, to respectively charge the pixel electrodes in two adjacent pixel units 200 of the same column at different times. That is to say, the composite transistor 300 can respectively open conductive paths between the two output terminals and the input terminal under the control of different levels of control voltages.

The above-described array substrate provided by the embodiment of the present invention, two adjacent rows of the pixel units are taken as a group of pixel unit rows; in each group of the pixel unit rows, since the pixel electrodes in two adjacent pixel units of the same column are respectively electrically connected with the two output terminals of one composite transistor, and the composite transistor can be turned on or off under the control of different levels of control voltages, to respectively charge the pixel electrodes in two adjacent pixel units of the same column at different times, each group of the pixel unit rows can share a gate line located between the two rows of the pixel unit, as compared with the conventional array substrate, the number of the gate lines disposed on the array substrate is reduced by half, so that the aperture ratio of the array substrate can be improved, and the brightness of the display panel can be further improved.

It should be noted that, in the above-described array substrate provided by the embodiment of the present invention, the composite transistor can be turned on or off under the control of different levels of control voltages, to respectively charge the pixel electrodes in two adjacent pixel units of the same column at different times, which specifically refers to that: the composite transistor is turned on or off under the control of different levels of control voltages, and when the composite transistor is turned on, the composite transistor can only charge the pixel electrodes in one pixel unit of the two adjacent pixel units of the same column at one time.

In above-described array substrate provided by the embodiment of the present invention, as illustrated in FIG. 2, the composite transistor 300 includes a first thin film transistor 310 and a second thin film transistor 320, an active layer of the first thin film transistor 310 and an active layer of the second thin film transistor 320 having opposite doping polarities;

In each group of the pixel unit rows, a drain electrode of the first thin film transistor 310 is electrically connected with the pixel electrodes of the pixel units 200 located in a first row, a drain electrode of the second thin film transistor 320 is electrically connected with the pixel electrodes of the pixel units 200 located in a second row, a gate electrode of the first thin film transistor 310 and a gate electrode of the second thin film transistor 320 are respectively electrically connected with the gate line Gate, and a source electrode of the first thin film transistor 310 and a source electrode of the second thin film transistor 320 are respectively electrically connected with the data line Data.

For example, the drain electrodes of the first thin film transistor 310 and the second thin film transistor 320 are respectively the two output terminals of the composite transistor 300, the source electrodes of the first thin film transistor 310 and the second thin film transistor 320 are the input terminal of the composite transistor 300, and the gate electrodes of the first thin film transistor 310 and the second thin film transistor 320 are the control terminal of the composite transistor 300.

The active layers of the first thin film transistor 310 and the second thin film transistor 320 have opposite doping polarities, so the first thin film transistor 310 and the second thin film transistor 320 have threshold voltages with opposite polarities.

Figure 3:
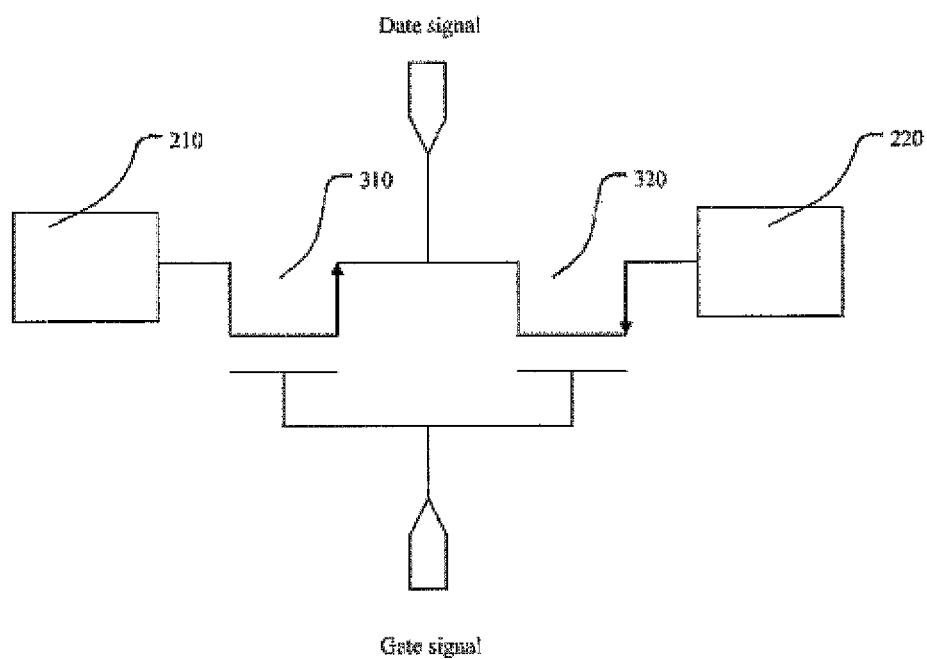
FIG. 3 is a circuit schematic diagram of two adjacent pixel units of a same column in each pixel unit row in the array substrate provided by the embodiment of the present invention.

For example, in above-described array substrate provided by the embodiment of the present invention, in each group of the pixel unit rows, a circuit schematic diagram of the two adjacent pixel units of the same column is illustrated in FIG. 3, including, a gate electrode scanning signal input terminal Gate signal, a first thin film transistor 310, a second thin film transistor 320, a pixel electrode 210 connected with the drain electrode of the first thin film transistor 310, a pixel electrode 220 connected with the drain electrode of the second thin film transistor 320, a data signal input terminal Data signal, wherein the gate electrode scanning signal input terminal Gate signal is connected with the gate electrode of the first thin film transistor 310 and the gate electrode of the second thin film transistor 320, and the data signal input terminal Data signal is connected with the source electrode of the first thin film transistor 310 and the source electrode of the second thin film transistor 320.

It should be noted that, in the above-described array substrate provided by the embodiment of the present invention, the active layer of the first thin film transistor and the active layer of the second thin film transistor in the composite transistor have opposite doping polarities, which refers to that: in the composite transistor, it may be that, for example, if the first thin film transistor is an N-type transistor, then the second thin film transistor is a P-type transistor; and if the first thin film transistor is a P-type transistor, then the second thin film transistor is an N-type transistor.

In the above-described array substrate provided by the embodiment of the present invention, since the active layer of the first thin film transistor and the active layer of the second thin film transistor in the composite transistor have opposite doping polarities, the gate electrode scanning signal on the gate line in the present invention totally has three voltage level states, i.e., a 0 bias, a forward bias, and a backward bias. A function of the forward bias is to turn on the thin film transistor with a doping polarity of the active layer as an N type, a function of the backward bias is to turn on the thin film transistor with a doping polarity of the active layer as a P type, and the 0 bias is a holding signal.

Figure 4A:
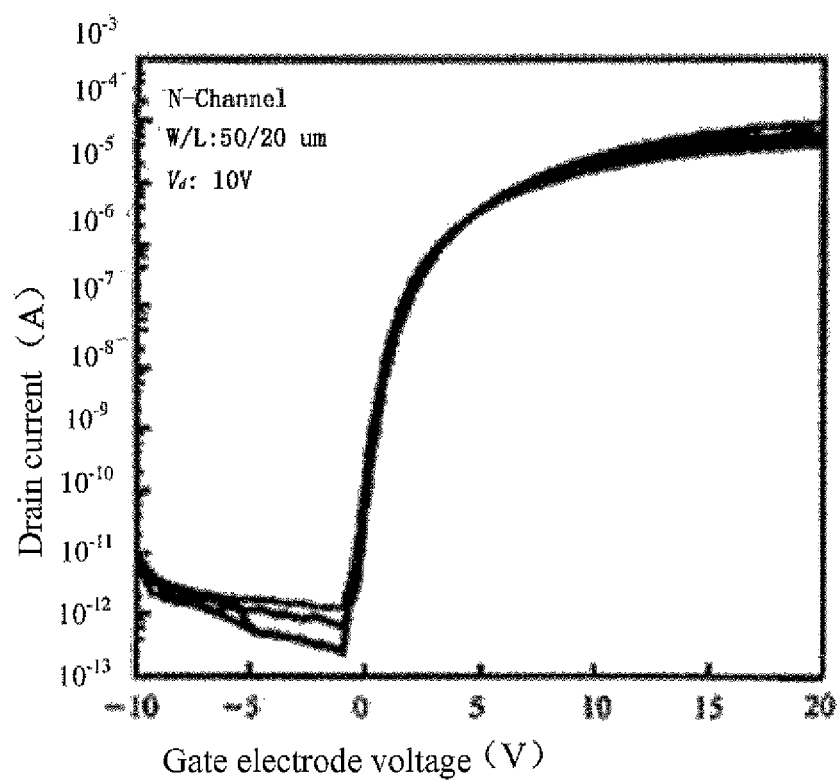
FIG. 4a is an output characteristic curve chart of a thin film transistor with a doping polarity of an active layer as an N type provided by an embodiment of the present invention.

In the embodiment of the present invention, an output characteristic curve chart of the thin film transistor with a doping polarity of the active layer as an N type is illustrated in FIG. 4a, when the gate electrode scanning signal is the backward bias, the thin film transistor with a doping polarity of the active layer as an N type is turned off; when the gate electrode scanning signal is the forward bias, the thin film transistor with a doping polarity of the active layer as an N type is turned on, the data signal can be transferred to the source electrode of the thin film transistor through the drain electrode of the thin film transistor, and further provided to the pixel electrodes though the source electrode of the N-type thin film transistor, to charge the pixel electrodes.

Figure 4B:
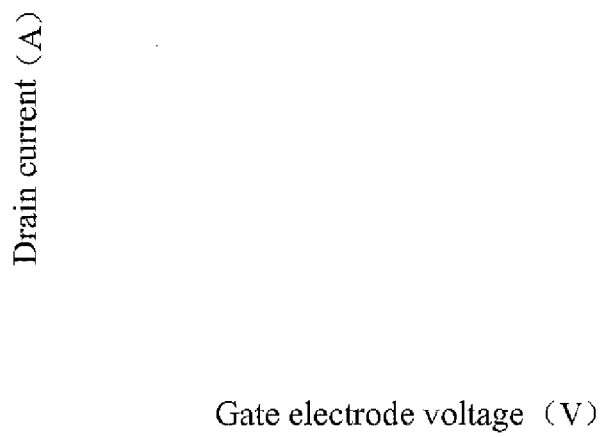
FIG. 4b is an output characteristic curve chart of a thin film transistor with a doping polarity of an active layer as a P type provided by an embodiment of the present invention.

In the embodiment of the present invention, an output characteristic curve chart of a thin film transistor with a doping polarity of an active layer as a P type is illustrated in FIG. 4b, when the gate electrode scanning signal is the backward bias, the thin film transistor with a doping polarity of the active layer as an P type is turned on, the data signal can be transferred to the source electrode of the thin film transistor through the drain electrode of the thin film transistor, and further provided to the pixel electrodes though the source electrode of the P-type thin film transistor, to charge the pixel electrodes, when the gate electrode scanning signal is the forward bias, the thin film transistor with a doping polarity of the active layer as a P type is turned off.

The composite transistor in this embodiment includes a first thin film transistor and a second thin film transistor, and an active layer of the first thin film transistor and an active layer of the second thin film transistor have opposite doping polarities, so each group of the pixel unit rows can share one gate line located between the two rows of the pixel units, as compared with the conventional array substrate, the number of the gate lines disposed on the array substrate is reduced by half, so that the aperture ratio of the array substrate can be improved, and the brightness of the display panel can be further improved.

Of course, the composite transistor may also be a semiconductor device of any other type, as long as the above-described functions can be implemented, which is not limited to the description of this embodiment.

Hereinafter, a working mode of the pixel units in the array substrate provided by the embodiment of the present invention will be illustrated by taking the doping polarity of the active layer of the first thin film transistor being an N type and the doping polarity of the active layer of the second thin film transistor being a P type as an example.

Figure 5:
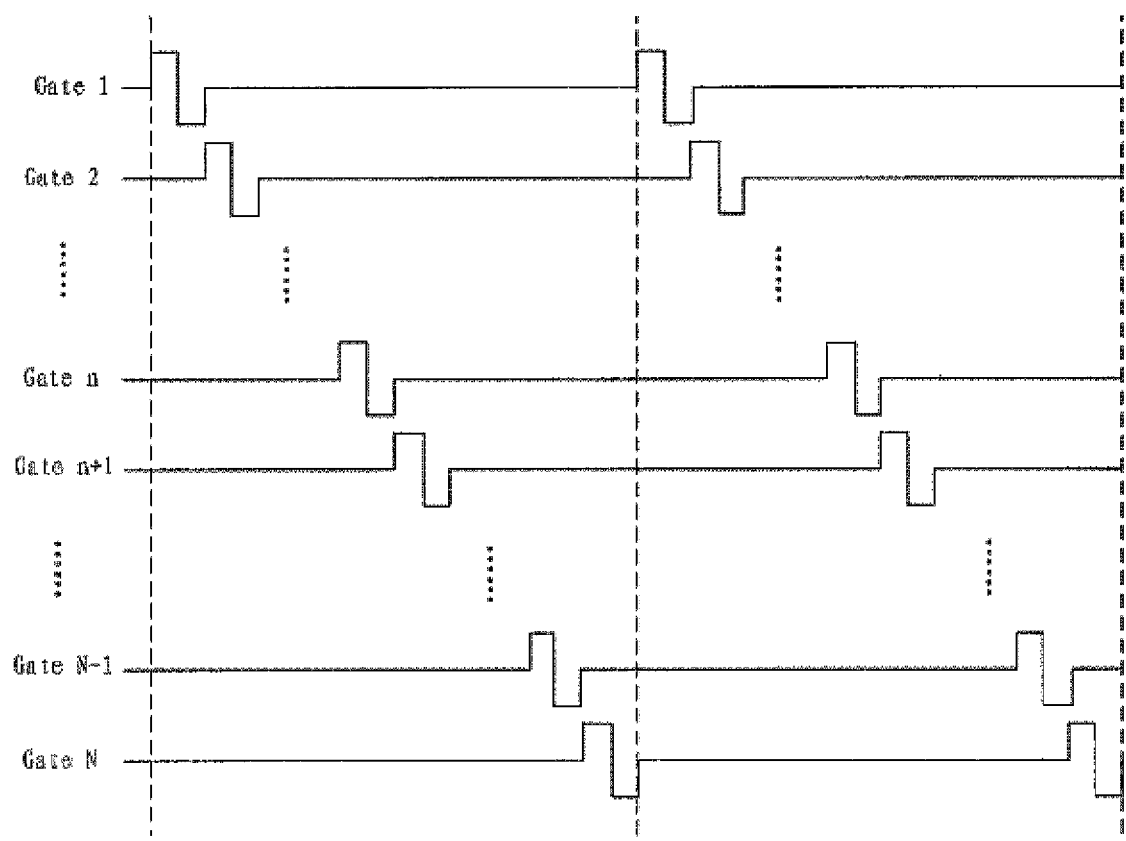
FIG. 5 is a sequence chart of gate electrode scanning signals of respective gate lines in the array substrate provided by the embodiment of the present invention.

For example, a sequence chart of a gate electrode scanning signal on the gate line on an array substrate is illustrated in FIG. 5; the gate line Gate n (n=1, 2, 3, . . . N, where N is the number of the gate lines on the array substrate) on the array substrate scans the gate electrode scanning signal in a line sequence; when the gate electrode scanning signal on the gate line Gate n is the forward bias, the first thin film transistor is in an ON state, and the second thin film transistor is in an OFF state, and at this time, the data line charges the pixel electrodes in the first row of the pixel units in the pixel unit row connected with the gate line; when the gate electrode scanning signal on the gate line Gate n is changed from the forward bias to the backward bias, the second thin film transistor is in an ON state, and the first thin film transistor in an OFF state, and at this time, the data line charges the pixel electrode in the second row of the pixel units in the pixel unit row connected with the gate line; when the gate electrode scanning signal on the gate line Gate n is changed from the backward bias to the 0 bias, at this time, both the first thin film transistor and the second thin film transistor are in an OFF state, the fully charged pixel units continue to hold the charges under an action of a storage capacitor, so that a deflected state of the liquid crystal remains unchanged till arrival of a next cycle, and at this time, the gate electrode scanning signal on the next gate line Gate n+1 is changed from the 0 bias sequentially to the forward bias and the backward bias, with a specific working mode being the same as that of the previous gate line Gate n, which will not be repeated here.

For example, in the above-described array substrate provided by the embodiment of the present invention, in order to further improve the aperture ratio of the array substrate, in a composite transistor, the first thin film transistor and the second thin film transistor are disposed in a stacking manner in a direction perpendicular to the base substrate. That is, when specific implementation is performed, the first thin film transistor is located between the second thin film transistor and the base substrate, or the second thin film transistor is located between the first thin film transistor and the base substrate, which will not be limited here.

For example, in the above-described array substrate provided by the embodiment of the present invention, the first thin film transistor is located between the base substrate and the second thin film transistor, the first thin film transistor being a thin film transistor of top gate type, and the second thin film transistor being a thin film transistor of bottom gate type; or, The second thin film transistor is located between the base substrate and the first thin film transistor, the first thin film transistor being the bottom-gate-type thin film transistor, and the second thin film transistor being the top-gate-type thin film transistor. Thus, in the composite transistor, regardless of the vertical positions of the first thin film transistor and the second thin film transistor, as long as it is ensured that the thin film transistor located below is of a top-gate-type structure, and the thin film transistor located above is of a bottom-gate-type structure, the process difficulty can be reduced. This is because the two thin film transistors in the composite transistor will be connected with the same gate line, so that the gate electrodes of the two thin film transistors are the closest, to facilitate the gate electrodes of the two thin film transistors being connected with the same gate line when being prepared.

Figure 6A:
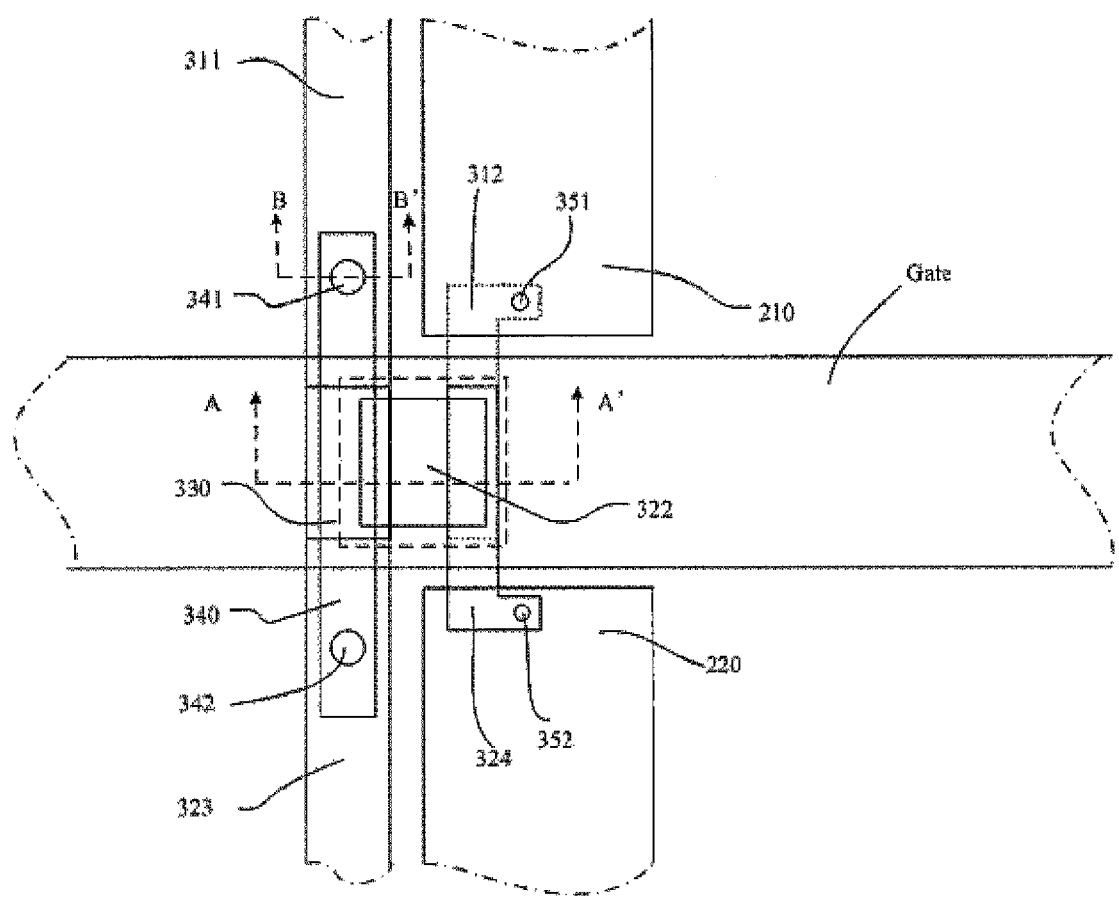
FIG. 6a is a schematic top view of an array substrate provided by an embodiment of the present invention.
Figure 6B:
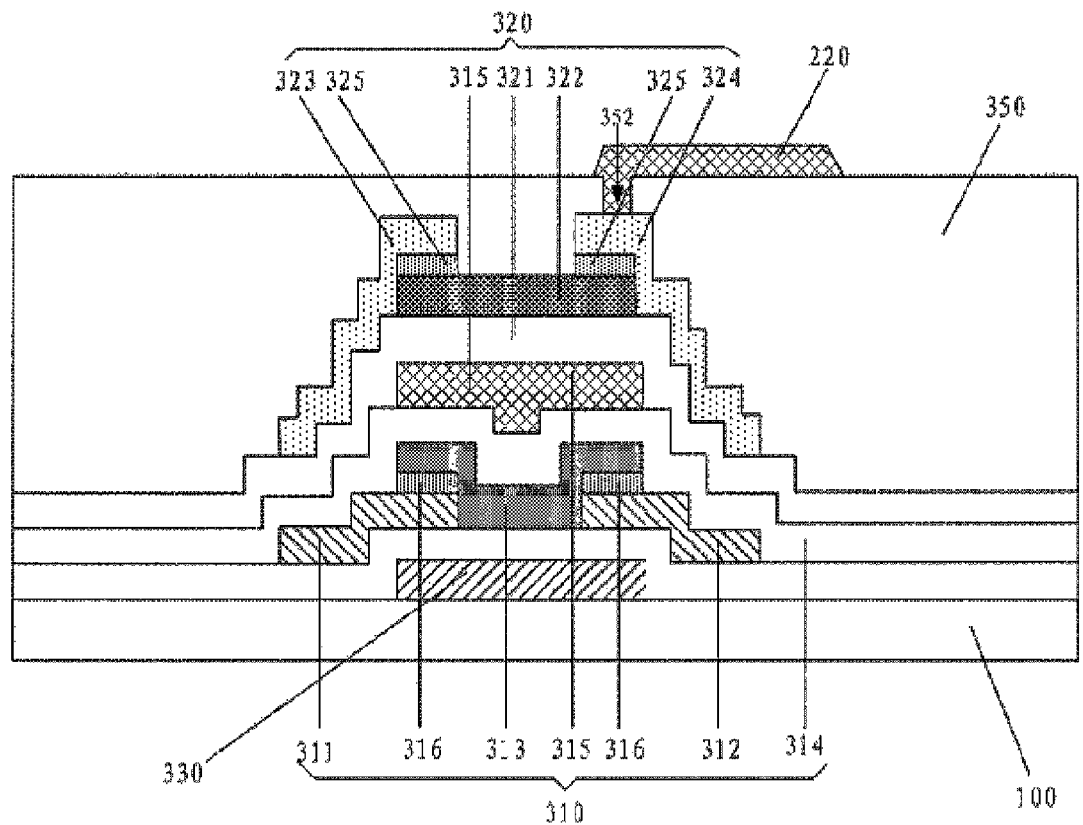

For example, in order to further simplify the preparation process, and save fabrication costs, in the above-described array substrate provided by the embodiment of the present invention, as illustrated in FIG. 6a and FIG. 6b, the first thin film transistor 310 and the second thin film transistor 320 share a gate electrode, wherein, FIG. 6b is a sectional view along an A-A' direction in FIG. 6a.

Hereinafter, that the first thin film transistor 310 and the second thin film transistor 320 share a gate electrode will bet illustrated by taking the first thin film transistor 310 being located between a base substrate 100 and the second thin film transistor 320 as an example, as illustrated in FIG. 6b, the first thin film transistor 310 includes a source electrode 311 and a drain electrode 312 disposed on the base substrate 100, an active layer 313 located above the source electrode 311 and the drain electrode 312, a first gate electrode insulating layer 314 located above the active layer 313, and a gate electrode 315 located above the first gate electrode insulating layer 314; the second thin film transistor 320 includes a gate electrode 315, a second gate electrode insulating layer 321 located above the gate electrode 315, an active layer 322 located above the second gate electrode insulating layer 321, a source electrode 323 and a drain electrode 324 located above the active layer 322; and further includes a passivation layer 350 located above the second thin film transistor 320, and the pixel electrodes located above the passivation layer 350, wherein the pixel electrode 220 of the pixel units located in the second row are electrically connected with the drain electrode 324 of the second thin film transistor 320 through a second via hole 352 running though the passivation layer 350; the pixel electrode 210 of the pixel units located in the first row are electrically connected with the drain electrode 312 of the first thin film transistor 310 through a first via hole 351 running though the first gate electrode insulating layer 314, the second gate electrode insulating layer 321 and the passivation layer 350 (wherein, the pixel electrodes 210 of the pixel units in the first row are electrically connected with the drain electrode 312 of the first thin film transistor 310 through the first via hole 351, as illustrated in FIG. 6a, but not illustrated in FIG. 6b).

For example, in the above-described array substrate provided by the embodiment of the present invention, in the composite transistor, as illustrated in FIG. 6a and FIG. 6b, the drain electrode 312 of the first thin film transistor 310 and the drain electrode 324 of the second thin film transistor 320 are located on the same side, and the source electrode 311 of the first thin film transistor 310 and the source electrode 323 of the second thin film transistor 320 are located on the same side. Thus, it facilitates the source electrode of the first thin film transistor and the source electrode of the second thin film transistor to be electrically connected with the same data line, when being prepared.

In order to simplify the preparation process, in the above-described array substrate provided by the embodiment of the present invention, in the composite transistor, the data line and the source electrode of the first thin film transistor can be disposed on a same layer, so that the source electrode of the second thin film transistor can be electrically connected with the data line through the via hole; or The data line and the source electrode of the second thin film transistor can be disposed on a same layer, so that the source electrode of the first thin film transistor can be electrically connected with the data line through the via hole.

Further, in the above-described array substrate provided by the embodiment of the present invention, the source electrode of the first thin film transistor and the source electrode of the second thin film transistor may also be electrically connected with the data line through the via hole by using a metal bar. Specifically, it is illustrated by taking the composite transistor with the structure illustrated in FIG. 6a as an example, as illustrated in FIG. 6a, the source electrode 311 of the first thin film transistor 310 is electrically connected with a metal bar 340 through a third via hole 341, the source electrode 323 of the second thin film transistor 320 is also electrically connected with the metal bar 340 through a fourth via hole 342, and the metal bar is electrically connected with the data line (which is not specifically illustrated in FIG. 6a); of course, in the above-described array substrate provided by the embodiment of the present invention, the source electrode of the first thin film transistor and the source electrode of the second thin film transistor may further be electrically connected with the data line in other modes, which will not be limited here.

Figure 6C:
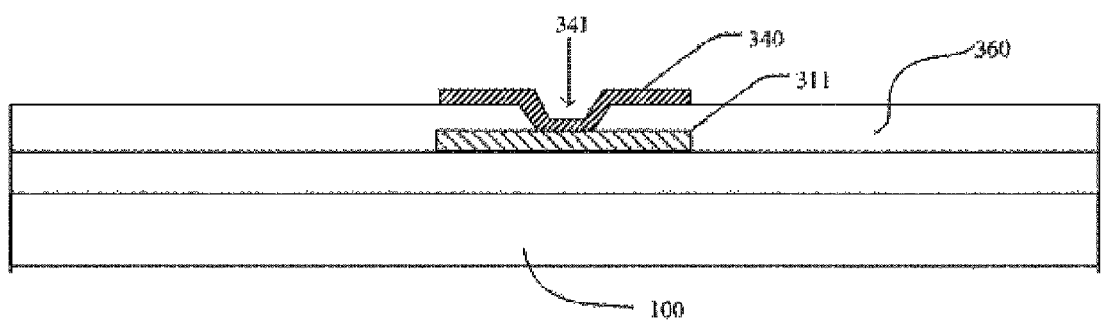

In the above-described array substrate provided by the embodiment of the present invention, in FIG. 6a, the source electrode 311 of the first thin film transistor 310 is electrically connected with the metal bar 340 through the third via hole 341, and the sectional view thereof along a B-B' direction is illustrated in FIG. 6c, wherein 360 in FIG. 6c indicates all the film layers located between the metal bar 340 and the source electrode 311 of the first thin film transistor 310.

For ease of implementation, in the above-described array substrate provided by the embodiment of the present invention, as illustrated in FIG. 6a and FIG. 6b, when the first thin film transistor 310 is located between the base substrate 100 and the second thin film transistor 320, a first light-blocking layer 330 may be further disposed between the base substrate 100 and the first thin film transistor 310, an orthographic projection of the first light-blocking layer 330 on the base substrate 100 covering an orthographic projection of the active layer 313 of the first thin film transistor 310 on the base substrate 100.

Of course, when the second thin film transistor is located between the base substrate and the first thin film transistor, a second light-blocking layer may be further disposed between the base substrate and the second thin film transistor, an orthographic projection of the second light-blocking layer on the base substrate covering an orthographic projection of the active layer of the second thin film transistor on the base substrate.

In the above-described array substrate provided by the embodiment of the present invention, a main function for disposing the first light-blocking layer or the second light-blocking layer in the composite transistor is to prevent the thin film transistor located below in the composite transistor from being irradiated by light to generate light-drain current, affecting performance of the thin film transistor.

When specific implementation is performed, the first light-blocking layer or the second light-blocking layer should also be insulated from the composite transistor.

In order to reduce the surface resistance among the source electrode, the drain electrode and the active layer in the thin film transistor, in the above-described array substrate provided by the embodiment of the present invention, as illustrated in FIG. 6b, a first ohmic contact layer 316 may be disposed between the active layer 313 and the source electrode 311, and between the active layer 313 and the drain electrode 312 of the first thin film transistor 310, and/or, a second ohmic contact layer 325 may be disposed between the active layer 322 and the source electrode 323, and between the active layer 322 and the drain electrode 324 of the second thin film transistor 320.

Further, the above-described array substrate provided by the embodiment of the present invention is applicable to a liquid crystal display device, and is also applicable to an organic light-emitting display device, which will not be limited here. Specifically, when the above-described array substrate provided by the embodiment of the present invention is applied to the organic light-emitting display device, the pixel electrode refers to an anode in the organic light-emitting structure.

Based on the same inventive concept, an embodiment of the present invention further provides a manufacturing method of an array substrate, comprising:

With reference to FIG. 2, forming a pattern including pixel electrodes of pixel units 200 (not illustrated in FIG. 2), a gate line Gate, a data line Data and a composite transistor 300 on a base substrate, wherein, With two adjacent rows of the pixel units 200 as a group of pixel unit rows (illustrated in a dashed box in FIG. 2), each group of the pixel unit row share a gate line Gate located between the two rows of the pixel units 200, and there is one data line Data between every two adjacent columns of the pixel units;

In each group of the pixel unit row, pixel electrodes in two adjacent pixel units 200 of a same column are respectively electrically connected with two output terminals of a composite transistor 300, control terminals of the respective composite transistors 300 being electrically connected with the gate line Gate, input terminals of the respective composite transistor being electrically connected with the data line Data;

The composite transistor 300 is turned on or off under the control of different levels of control voltages, to respectively charge the pixel electrodes in two adjacent pixel units 200 of the same column at different times.

In the above-described manufacturing method provided by the embodiment of the present invention, the forming a pattern of a composite transistor on the base substrate, may include:

Forming a pattern including a first thin film transistor and a second thin film transistor on the base substrate;

As illustrated in FIG. 2, an active layer of the first thin film transistor 310 and an active layer of the second thin film transistor 320 have opposite doping polarities; in each group of the pixel unit rows, a drain electrode of the first thin film transistor 310 is electrically connected with the pixel electrodes of the pixel units 200 located in a first row, a drain electrode of the second thin film transistor 320 is electrically connected with the pixel electrodes of the pixel units 200 located in a second row, a gate electrode of the first thin film transistor 310 and a gate electrode of the second thin film transistor 320 are respectively electrically connected with the gate line Gate, and a source electrode of the first thin film transistor 310 and a source electrode of the second thin film transistor 320 are respectively electrically connected with the data line Data.

Hereinafter, the manufacturing method of the array substrate provided by the embodiment of the present invention will be illustrated in detail with the array substrate illustrated in FIG. 6a and FIG. 6b as an example, specifically, the forming a pattern including a first thin film transistor 310 and a second thin film transistor 320 on the base substrate 100, may include:

Forming a pattern including a source electrode 311 and a drain electrode 312 of the first thin film transistor 310 on the base substrate 100;

Forming a pattern including an active layer 313 of the first thin film transistor 310 on the source electrode 311 and the drain electrode 312 of the first thin film transistor 310;

Forming a first gate electrode insulating layer 314 on the active layer 313 of the first thin film transistor 310 and forming a pattern including a gate electrode 315 on the first gate electrode insulating layer 314;

Forming a second gate electrode insulating layer 321 on the gate electrode 315, and forming a pattern including an active layer 322 of the second thin film transistor 320 on the second gate electrode insulating layer 321;

Forming a pattern including a source electrode 323 and a drain electrode 324 of the second thin film transistor 320 on the active layer 322 of the second thin film transistor 320.

It should be noted that, in the array substrate prepared by the above-described manufacturing method provided by the embodiment of the present invention, the first thin film transistor and the second thin film transistor in a composite transistor share a gate electrode, which thus can reduce the process steps for preparing a transistor, and further reduce the preparation costs. However, the embodiment of the present invention is not limited thereto.

To further simplify the preparation process, and reduce the fabrication costs, in the above-described manufacturing method provided by the embodiment of the present invention, the forming a pattern including data lines on the base substrate, may include:

Forming the pattern including the data lines on the base substrate while forming the pattern including the source electrode and the drain electrode of the first thin film transistor on the base substrate, the source electrode of the second thin film transistor being electrically connected with the data lines.

When specific implementation is performed, since the source electrode and the data line of the first thin film transistor are located on the same layer, part of the data line may directly protrude as the source electrode of the first thin film transistor, which also implements that the source electrode of the first thin film transistor can be electrically connected with the data line; since the source electrode of the second thin film transistor and the data line are located on different layers, the source electrode of the second thin film transistor can be electrically connected with the data line through the via hole, which will not be limited here.

Alternatively, in order to simplify the preparation process and reduce the fabrication costs, in the above-described manufacturing method provided by the embodiment of the present invention, the forming a pattern including data lines on the base substrate, may include:

Forming the pattern including the data lines on the active layer of the second thin film transistor while forming the pattern including the source electrode and the drain electrode of the second thin film transistor on the active layer of the second thin film transistor, the source electrode of the first thin film transistor being electrically connected with the data lines.

When specific implementation is performed, since the source electrode and the data line of the first thin film transistor are located on different layers, the source electrode of the first thin film transistor can be electrically connected with the data line through the via hole; and since the source electrode of the second thin film transistor and the data line are located on the same layer, part of the data line may directly protrude as the source electrode of the second thin film transistor, which also implements that the source electrode of the second thin film transistor can be electrically connected with the data line, which will not be limited here.

In order to simplify the preparation process and reduce the fabrication costs, in the above-described manufacturing method provided by the embodiment of the present invention, the forming a pattern including gate lines on the base substrate, may include:

Forming a pattern including the gate lines on the active layer of the first thin film transistor while forming the pattern including the gate electrode insulated from the active layer on the active layer of the first thin film transistor.

In the above-described manufacturing method provided by the embodiment of the present invention, the forming a pattern including pixel electrodes of pixel units on the base substrate, may include:

With reference to FIG. 2, FIG. 6a and FIG. 6b, forming a passivation layer 350 above the drain electrode of the second thin film transistor 320 and forming a pattern including the pixel electrodes of the pixel units on the passivation layer 350 after forming the pattern including the source electrode 323 and the drain electrode 324 of the second thin film transistor 320 on the base substrate 100; wherein, the pixel electrodes 210 in the pixel units located in the first row are electrically connected with the drain electrode of the first thin film transistor 310 through a first via hole 351 (wherein the first via hole is not illustrated in FIG. 6b) running through the first gate electrode insulating layer 314, the second gate electrode insulating layer 321 and the passivation layer 350, and the pixel electrodes 220 in the pixel units located in the second row are electrically connected with the drain electrode 324 of the second thin film transistor 320 through a second via hole 352 running through the passivation layer 350.

In the above-described manufacturing method provided by the embodiment of the present invention, after forming the pattern including the source electrode and the drain electrode of the first thin film transistor on the base substrate, and before forming the pattern including the active layer of the first thin film transistor on the source electrode and the drain electrode of the first thin film transistor, as illustrated in FIG. 6b, the method further comprises: forming a pattern including a first ohmic contact layer 316 between the source electrode 311 and the to-be-formed active layer 313 of the first thin film transistor 310, and between the drain electrode 312 and the to-be-formed active layer 313 of the first thin film transistor 310; and/or After forming the pattern including the active layer of the second thin film transistor insulated from the gate electrode on the gate electrode, and before forming the pattern including the source electrode and the drain electrode of the second thin film transistor on the active layer of the second thin film transistor, as illustrated in FIG. 6b, the method further comprises: forming a pattern including a second ohmic contact layer 325 between the active layer 322 and the to-be-formed source electrode 323 of the second thin film transistor 320, and between the active layer 322 and the to-be-formed drain electrode 324 of the second thin film transistor 320.

The above-described manufacturing method provided by the embodiment of the present invention, before forming the pattern including the source electrode and the drain electrode of the first thin film transistor on the base substrate, the method further comprises:

As illustrated in FIG. 6b, forming a pattern including a first light-blocking layer 330 between the base substrate 100 and the to-be-formed first thin film transistor 310, an orthographic projection of the first light-blocking layer 330 on the base substrate 100 covering an orthographic projection of the active layer 313 of the first thin film transistor 310 on the base substrate 100.

Based on the same inventive concept, an embodiment of the present invention further provides a display device, comprising the above-described array substrate according to the embodiment of the present invention, the display device may be: a mobile phone, a tablet personal computer, a television, a monitor, a laptop, a digital photo frame, a navigator, and any other product or component having a display function. For all the other essential components of the display device, those ordinarily skilled in the art should understand as that there are the same, which will not be repeated here, and should not be a limitation to the present invention.

The foregoing embodiments merely are exemplary embodiments of the invention, and not intended to define the scope of the invention, and the scope of the invention is determined by the appended claims.

The present application claims priority of Chinese Patent Application No. 201410041098.5 filed on Jan. 27, 2014, the disclosure of which is incorporated herein by reference in its entirety as part of the present application.

What is claimed is:

1. An array substrate, comprising a base substrate, and a plurality of pixel units arranged in a matrix, each of which has a pixel electrode, wherein, with two adjacent rows of the pixel units as a group of pixel unit rows, each group of the pixel unit rows share one gate line located between the two rows of the pixel units, and there is one data line between every two adjacent columns of the pixel units;

in each group of the pixel unit row, pixel electrodes in two adjacent pixel units of a same column are respectively electrically connected with two output terminals of a composite transistor, a control terminal of the composite transistor being electrically connected with the gate line, and an input terminal of the composite transistor being electrically connected with the data line; wherein, the composite transistor respectively opens conductive paths between the two output terminals and the input terminal under control of different levels of control voltages, wherein the composite transistor includes a first thin film transistor and a second thin film transistor which are disposed in a stacking manner in a direction perpendicular to the base substrate; one of the first thin film transistor and the second thin film transistor is of top gate type, and the other one is of bottom gate type; and wherein the first thin film transistor and the second thin film transistor share a gate electrode.

2. The array substrate according to claim 1, wherein, the composite transistor further includes an active layer of the first thin film transistor and an active layer of the second thin film transistor have opposite doping polarities; wherein, in each group of the pixel unit rows, a drain electrode of the first thin film transistor is electrically connected with the pixel electrode of the pixel unit located in a first row, a drain electrode of the second thin film transistor is electrically connected with the pixel electrode of the pixel unit located in a second row, a gate electrode of the first thin film transistor and a gate electrode of the second thin film transistor are respectively electrically connected with the gate line, and a source electrode of the first thin film transistor and a source electrode of the second thin film transistor are respectively electrically connected with the data line; the drain electrode of the first thin film transistor and the drain electrode of the second thin film transistor are respectively the two output terminals of the composite transistor, the source electrode of the first thin film transistor and the source electrode of the second thin film transistor are the input terminal of the composite transistor, and the gate electrode of the first thin film transistor and the gate electrode of the second thin film transistor are the control terminal of the composite transistor.

3. The array substrate according to claim 2, wherein, threshold voltages of the first thin film transistor and the second thin film transistor have opposite polarities.

4. The array substrate according to claim 3, wherein, the data line and the source electrode of the first thin film transistor are disposed on a same layer, and the source electrode of the second thin film transistor is electrically connected with the data line through a via hole; or the data line and the source electrode of the second thin film transistor are disposed on a same layer, and the source electrode of the first thin film transistor is electrically connected with the data line through a via hole.

5. The array substrate according to claim 1, wherein, the first thin film transistor is located between the base substrate and the second thin film transistor; or, the second thin film transistor is located between the base substrate and the first thin film transistor.

6. The array substrate according to claim 5, wherein, the first thin film transistor is located between the base substrate and the second thin film transistor, a first light-blocking layer is disposed between the base substrate and the first thin film transistor, and an orthographic projection of the first light-blocking layer on the base substrate covers an orthographic projection of the active layer of the first thin film transistor on the base substrate; or the second thin film transistor is located between the base substrate and the first thin film transistor, a second light-blocking layer is disposed between the base substrate and the second base substrate, and an orthographic projection of the second light-blocking layer on the base substrate covers an orthographic projection of the active layer of the second thin film transistor on the base substrate.

7. The array substrate according to claim 5, wherein, a first ohmic contact layer is disposed between the active layer and the source electrode, and between the active layer and the drain electrode of the first thin film transistor; and/or, a second ohmic contact layer is disposed between the active layer and the source electrode, and between the active layer and the drain electrode of the second thin film transistor.

8. A display device, comprising the array substrate according to claim 1.

9. The array substrate according to claim 1, wherein, the data line and the source electrode of the first thin film transistor are disposed on a same layer, and the source electrode of the second thin film transistor is electrically connected with the data line through a via hole; or the data line and the source electrode of the second thin film transistor are disposed on a same layer, and the source electrode of the first thin film transistor is electrically connected with the data line through a via hole.

* * * * *